(12) United States Patent
Gonzales et al.

(10) Patent No.: US 6,807,106 B2
(45) Date of Patent: Oct. 19, 2004

(54) HYBRID DENSITY MEMORY CARD

(75) Inventors: Carlos Gonzales, Los Gatos, CA (US); Shahzad B. Khalid, Union City, CA (US)

(73) Assignee: SanDisk Corporation, Sunnyvale, CA (US)

( * ) Notice: Subject to any disclaimer, the term of this patent is extended or adjusted under 35 U.S.C. 154(b) by 502 days.

(21) Appl. No.: 10/017,035

(22) Filed: Dec. 14, 2001

(65) Prior Publication Data

US 2003/0112692 A1 Jun. 19, 2003

(51) Int. Cl.[7] ................................................. G11C 7/00
(52) U.S. Cl. .............................. 365/185.33; 365/230.03
(58) Field of Search ........................ 365/185.33, 230.03; 361/737; 710/301

(56) References Cited

U.S. PATENT DOCUMENTS

| | | | |
|---|---|---|---|
| 5,541,886 A | 7/1996 | Hasbun ................ | 365/230.01 |
| 5,598,370 A | 1/1997 | Niijima et al. | |
| 5,862,074 A | 1/1999 | Park | |
| 5,930,167 A | 7/1999 | Lee et al. | |
| 5,982,663 A | 11/1999 | Park | |
| 6,046,933 A | 4/2000 | Nobukata et al. ...... | 365/185.03 |
| 6,064,591 A | 5/2000 | Takeuchi et al. ....... | 365/185.03 |
| 6,067,248 A | 5/2000 | Yoo ...................... | 365/185.03 |
| 6,563,749 B2 * | 5/2003 | Ferrant ................. | 365/200 |
| 2001/0009505 A1 * | 7/2001 | Nishizawa et al. ...... | 361/737 |
| 2003/0028699 A1 * | 2/2003 | Holtzman et al. ....... | 710/301 |

FOREIGN PATENT DOCUMENTS

EP   0 766 254 A2   4/1997

OTHER PUBLICATIONS

Cho et al., "A Dual–Mode NAND Flash Memory: 1–Gb Multilevel and High–Performance 512–Mb Single–Level Modes," IEEE Journal of Solid–State Circuits, vol. 36, No. 11, Nov. 2001.

* cited by examiner

Primary Examiner—Vu A. Le
(74) Attorney, Agent, or Firm—Beyer Weaver & Thomas, LLP

(57) ABSTRACT

A memory system (e.g., memory card) offering hybrid density storage is disclosed. The memory system yields both high density storage and high performance operation. According to one aspect, certain data to be stored in the memory system can be stored in lower density storage so that it provides robust storage and/or high speed retrieval. Other data, which can be retrieved at moderate speeds or moderate robustness, can be stored to higher density storage in a space (area) efficient manner.

16 Claims, 5 Drawing Sheets

HYBRID DENSITY MEMORY CARD

BACKGROUND OF THE INVENTION

1. Field of the Invention

The invention relates to a memory system for data storage and, more particularly, to a hybrid density memory system for data storage.

2. Description of the Related Art

Memory cards are commonly used to store digital data for use with various products (e.g., electronic products). Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

These memory cards are increasingly called on to store greater and greater amounts of data. Consequently, individual storage elements within these memory cards have been developed to support multiple levels so as to effectively store multiple bits of data. Traditional storage elements store only two states, while multiple level or high density storage elements store more than two states (e.g., four states). For example, individual storage elements in some of today's multiple-level memory cards can store four (4) levels and thus effectively enable a single storage element to act as two (2) bits of data. While these multiple levels allow a memory array to store substantially greater amounts of data without a corresponding increase in size or cost, it is more difficult to read stored data out of the memory array. As a result, performance (primarily, read performance) of the memory card is negatively impacted.

Thus, there is a need for improved approaches for providing high density storage while maintaining high performance operation of memory cards.

SUMMARY OF THE INVENTION

Broadly speaking, the invention relates to a memory system (e.g., memory card) offering hybrid density storage. The memory system yields both high density storage and high performance operation. According to one aspect of the invention, certain data to be stored in the memory system can be stored in lower density storage so that it provides robust storage and/or high speed retrieval. Other data, which can be retrieved at moderate speeds or moderate robustness, can be stored to higher density storage in a space (area) efficient manner.

The invention can be implemented in numerous ways. For example, the invention can be implemented as a system, device or method. Several embodiments of the invention are discussed below.

As a memory system that couples to a host, one embodiment of the invention includes at least a plurality of storage elements, a first portion of the storage elements being configured for low density storage, and a second portion of the storage elements being configured for high density storage; and a controller operatively connected to the storage elements, the controller operates to receive commands for data access from the host and to control reading and writing of data into the storage elements in accordance with the commands.

As a hybrid memory device having a single substrate, one embodiment of the invention includes at least a plurality of low density storage elements, a plurality of high density storage elements, and a controller operatively connected to the low density storage elements and the high density storage elements. The controller operates to control read, write and erasure of data into the low density storage elements and the high density storage elements.

As a portable memory card, one embodiment of the invention includes at least a data storage array, the data storage array including at least a first area of data storage having a first degree of robustness and a second area of data storage having a second degree of robustness; and a controller operatively connected to the storage elements, the controller operating to control reading and writing to the data storage array.

As a portable memory card, another embodiment of the invention includes at least a data storage array, the data storage array including at least a first area of data storage having a first density of data storage and a second area of data storage having a second density of data storage, the second density being at least twice that of the first density; and a controller operatively connected to the storage elements, the controller operates to control reading and writing to the data storage array.

As a method for rapidly forming an address translation table for a memory product having data storage elements arranged in logical blocks, each of the logical blocks including a plurality of data units, each of the data units having a header portion and a data portion, one embodiment of the invention includes at least the operations of: determining that the address translation table needs to be generated; reading the header portion of at least one of the data units within each of the logical blocks; determining physical addresses for each of the logical blocks from the corresponding header portion read; and forming the address translation table by saving the physical addresses in association with logical addresses for the logical blocks corresponding thereto.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to a memory system offering hybrid density storage. According to one aspect of the invention, certain data to be stored in the memory system can be stored in lower density storage so that it provides robust storage and/or high speed retrieval. Other data, which can be retrieved at moderate speeds or moderate robustness, can be stored to higher density storage in a space (area) efficient manner.

The memory system is, for example, associated with a memory card (such as a plug-in card), a memory stick, or some other semiconductor memory product. Examples of memory cards include PC Card (formerly PCMCIA device), Flash Card, Flash Disk, Multimedia Card, and ATA Card.

Embodiments of this aspect of the invention are discussed below with reference to FIGS. 1–5. However, those skilled in the art will readily appreciate that the detailed description given herein with respect to these figures is for explanatory purposes as the invention extends beyond these limited embodiments.

Figure 1:
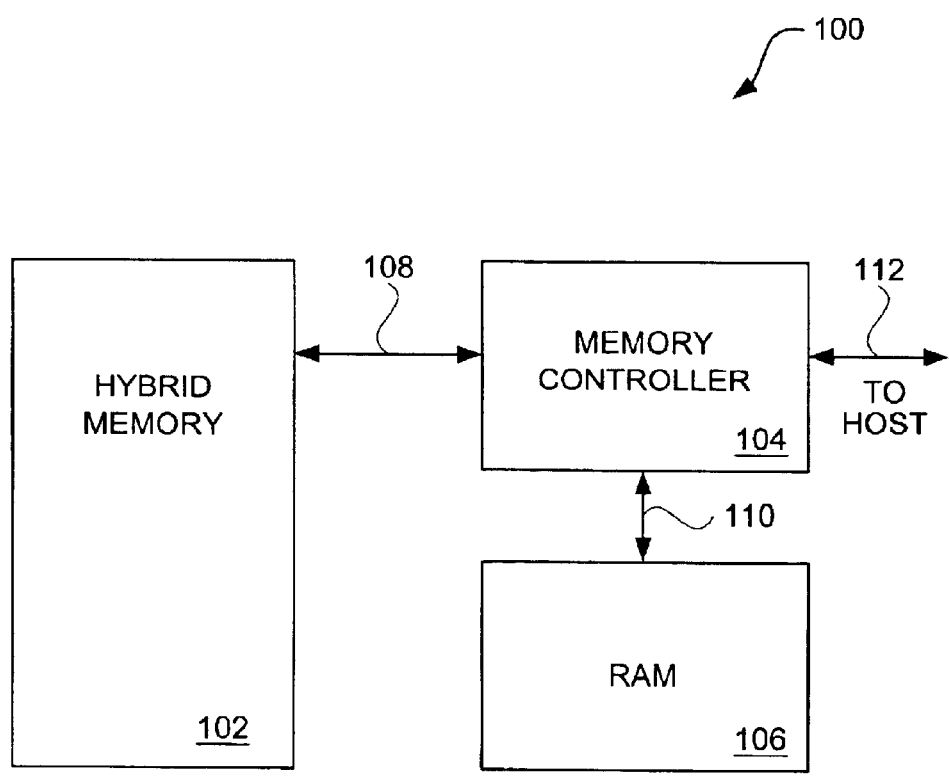
FIG. 1 is a block diagram of a memory system according to one embodiment of the invention.

FIG. 1 is a block diagram of a memory system 100 according to one embodiment of the invention. The memory system 100 includes a hybrid memory 102, a memory controller 104, and a Random-Access Memory (RAM) 106. A first bus 108 couples the hybrid memory 102 to the memory controller 104. A second bus 110 couples the RAM 106 to the memory controller 104. The memory controller 104 of the memory system 100 couples with a host (or host controller) via a host bus 112. The host (or host controller) controls the overall storage and retrieval of data from the hybrid memory 102.

The hybrid memory 102 includes an array of data storage elements. The hybrid memory 102 is referred to as a hybrid because the data storage elements are operated in at least two different density modes. Those data storage elements operating in a first density mode, referred to as a low density mode, are able to store data to be stored such that it can be accessed with greater speed or robustness than higher density storage. Those data storage elements in a second density mode, referred to as a high density mode, are able to store data to be stored such that it can be stored with greater density. Hence, those data elements operating in the high density mode require greater access time and offer less robustness than do those data storage elements operating in the low density mode.

The memory controller 104 interacts with the hybrid memory 102 to read, write and erase data to the various data storage elements. Regardless of the density mode being utilized by the data storage elements, the write and erase operations can be the same. With respect to reading of data from the data storage elements, although the reading again could be the same, to achieve the advantages offered by the hybrid memory configuration, the memory controller 104 is able to discriminate the read data stored in those data storage elements in the low density mode with greater speed than can be achieved with respect to data storage elements in the high density mode. In general, the differentiation between high and low density data storage elements can be controlled by the memory controller 104 or external hardware or software at the host.

The memory system 100 includes the RAM 106 to store configuration, control or other temporary data. It should be noted that the hybrid memory 102 is typically non-volatile, whereas the RAM 106 is volatile memory. In one embodiment of the invention, the hybrid memory 102 uses a logical array arrangement and thus the RAM 106 can be used to store one or more address translation tables to convert between physical addresses and logical addresses. Given that the address conversion tables are determined dynamically, overall performance of the memory is degraded. In addition, the delay overhead associated with creating such address conversion tables can be problematic to use of the memory system 100, particularly in real-time (or near real-time) environments because this delay overhead impacts memory access times.

Additionally, due to cost considerations for the memory system 100, the size of RAM 106 needs to remain fairly limited. As a result, only a portion of the address conversions potentially needed by the hybrid memory 102 or at any given point are stored in the RAM 106. Hence, as needed and on a dynamic basis, the memory controller 104 may need to produce an additional address conversion table (or alter an existing address conversion table) and store it to the RAM 106 before access to the hybrid memory 102 is available. In such situations, the access time for accessing data stored in high density regions of the hybrid memory 102 could be subject to significant delay. Fortunately, according to one embodiment of the invention, the information stored in the hybrid memory 102 that is utilized in creating the address conversion tables is stored in data storage elements operating in a low density mode so that access time is only minimally delayed. As a result, the address conversion table needed is able to be rapidly produced and thus access to the requested data in the hybrid memory 102 can be achieved in less time than conventionally possible from a high density memory.

Data stored in data storage elements operating in a high density mode is less robust than data stored in data storage elements operating in a low density mode because disturbs, noise and other factors that affect reliability of data, are more likely. Those data storage elements operating in the low density mode may also be treated in such a way so as to have higher endurance than those data storage elements used to store data in the high density mode. Accordingly, it may be beneficial to store data in those data storage elements operating in a low density mode when any of the following criteria is present, namely: data that must be read or written often, data that must be read at critical times, data that may heavily impact performance, or data that requires additional robustness. Moreover, given the greater robustness of data storage elements operating in a low density mode, weaker (or none at all) forms of error correction (e.g., ECC, CRC, parity, etc.) can be used as compared to that needed with data storage elements operating in a high density mode.

There are a number of tradeoff options. While the low density mode offers fast read operations, the downside is that additional data storage elements are required to store the same amount of information. Accordingly, there is a space-performance tradeoff. The hybrid memory 102 could also use more than two density modes. For example, the hybrid memory 102 could utilize a low density mode, a moderate density mode and a high density mode. Although low density mode and high density mode are relative, as an example, if low density storage is when each data storage element stores one or perhaps two bits of data, then high density storage is when each data storage element stores three or more bits of data. A data storage element storing more than one bit is known as a multi-level data storage element. For example, a data storage element with high density storage for storing four bits of data provides sixteen (16) different levels within the data storage element.

In general, overhead data associated with a block (e.g., sector) can be stored in a lower density than the data of the block. In this way, the overhead information can be read separately from the data quickly in order to determine physical address or other characteristics of the block of data.

The more rapid availability of the overhead information allows read access performance to be improved.

The memory system may utilize an erase-pooling scheme in allocating its blocks. For detailed information on erase-pooling, see U.S. patent application Ser. No. 09/766,436, filed Jan. 19, 2001, and entitled "Partial Block Data Programming and Reading Operations in a Non-Volatile Memory," which is hereby incorporated herein by reference. The erase-pooling scheme requires many read operations to determine where data has been written. When first accessing a new region of the hybrid memory, reading of overhead information for a block can cause substantial delay, thus causing problems with real-time operations (e.g., MP3 players). For example, in a real-time audio application, the user might hear a skip in the music. This unwanted delay can be reduced if the overhead information is stored in low density data storage elements, thereby reducing the data search operation and overall data access performance. The drawback of such an approach is that the portion of the overhead information written in the lower density storage requires more data storage area. This means that extra space needs to be allocated to store the overhead information. This scheme may be applicable to the case in which overhead data is stored contiguous to the block (e.g., sector) within the same physical field, or in the case in which overhead is stored separate from the block (e.g., system sectors). The overhead data in either case may have a separate CRC, ECC, parity or other field that is used for the block data to improve the reliability of the read of the overhead information.

The invention is particularly suitable for any type of flash data storage and across a variety of different densities. The flash memory cells used to store lower density information may not be any different from those used for high density data. The differentiation between high and low density cell usage may be performed by controlling circuitry in the flash memory device or external controlling hardware or software. Additionally, although preferably implemented on a single chip, separate chips of varying densities could also be utilized (i.e., not necessarily on the same chip, block or sector). Moreover, the memory system 100 can be implemented on a single chip (semiconductor chip), such as a System-On-a-Chip (SOC), or can be implemented on a plurality of chips. For example, the hybrid memory 102 can be implemented on one chip, and the memory controller 104 and the RAM 106 can be implemented remotely within a host system.

Figure 2:
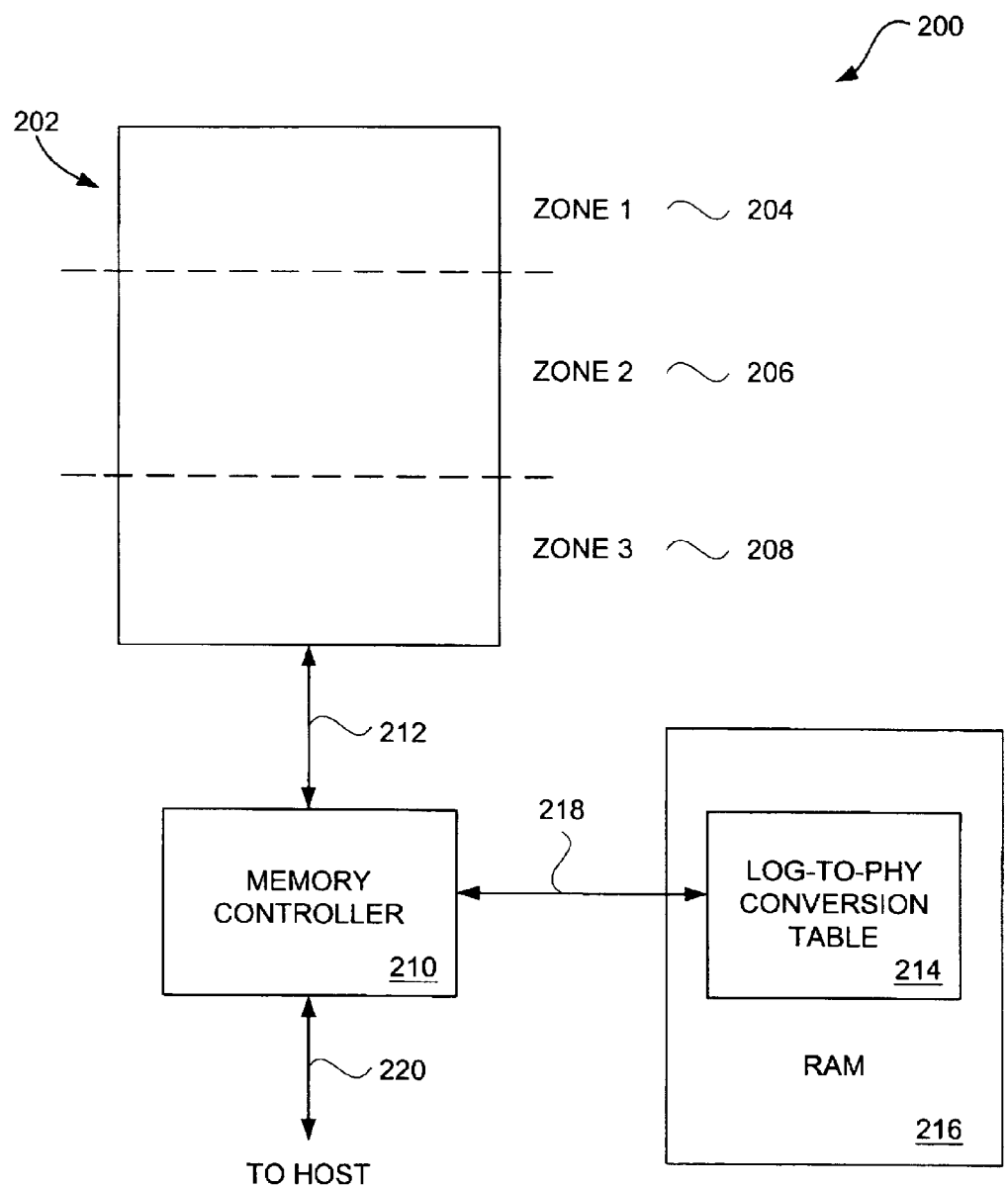
FIG. 2 is a block diagram of a memory system according to another embodiment of the invention.

FIG. 2 is a memory system 200 according to one embodiment of the invention. The memory system 200 includes a memory array 202 that includes a first zone (zone 1) 204, a second zone (zone 2) 206, and a third zone (zone 3) 208. The memory system 200 also includes a memory controller 210. The memory controller 210 couples to the memory array 202 by a memory bus 212. The memory system 200 further includes a logical-to-physical conversion table 214 stored in a RAM 216. The logical-to-physical conversion table 214 stores the address conversion information between logical addresses and physical addresses. The memory controller 210 couples to the RAM 216 (and thus the logical-to-physical conversion table 214) through a conversion bus 218 and couples to a host by way of a host bus 220. When the host requests to access data in the memory system 200, the memory controller 210 receives a logical address corresponding to the data to be accessed. The memory controller 210 then interacts with the logical-to-physical table 214 to convert the logical address of the data to be accessed into a physical address in the memory array 202. Then, the memory controller 210 accesses the data in the appropriate zone of the memory array 202 using the physical address. The retrieved data is then returned to the host.

According to the invention, a portion of the data storage elements within the memory array 202 are utilized in a lower density mode of operation than are other data storage elements within the memory array 202. In particular, overhead information associated with the logical-to-physical address conversions are stored in the memory array 202 in a low density format, such that the memory controller 210 is able to rapidly retrieve the overhead information. The overhead information is needed in order to determine address conversion information that is to be stored in the logical-to-physical conversion table 214 before the data can be accessed. The speed in which such logical-to-physical conversion table 214 can be produced is important because the amount of storage (i.e., RAM 216) utilized for these conversion tables is limited. In other words, only a portion of the needed address conversions are able to be stored at any given point. For example, with respect to FIG. 2, if the memory array 202 supports three zones, then, as an example, assume that the logical-to-physical conversion table 214 can store the address conversions associated with only one of the three zones. Hence, if data to be accessed is in the other of the two remaining zones, then prior to the access of such data, the needed address conversions would need to be created and stored in the logical-to-physical conversion table 214 (which would displace the previously stored address conversion information stored therein).

The memory array 202 of the memory system 200 shown in FIG. 2 can take many forms and configurations. The memory elements of the memory array 202 can also be constructed in a variety of ways. The memory elements provide non-volatile digital data storage. The invention is well suited for use with memory arrays that use Flash or EEPROM memory storage elements. The memory array 202 is normally provided on a single substrate or integrated circuit; however, the memory array 202 could also be formed from multiple substrates or integrated circuits.

Figure 3:
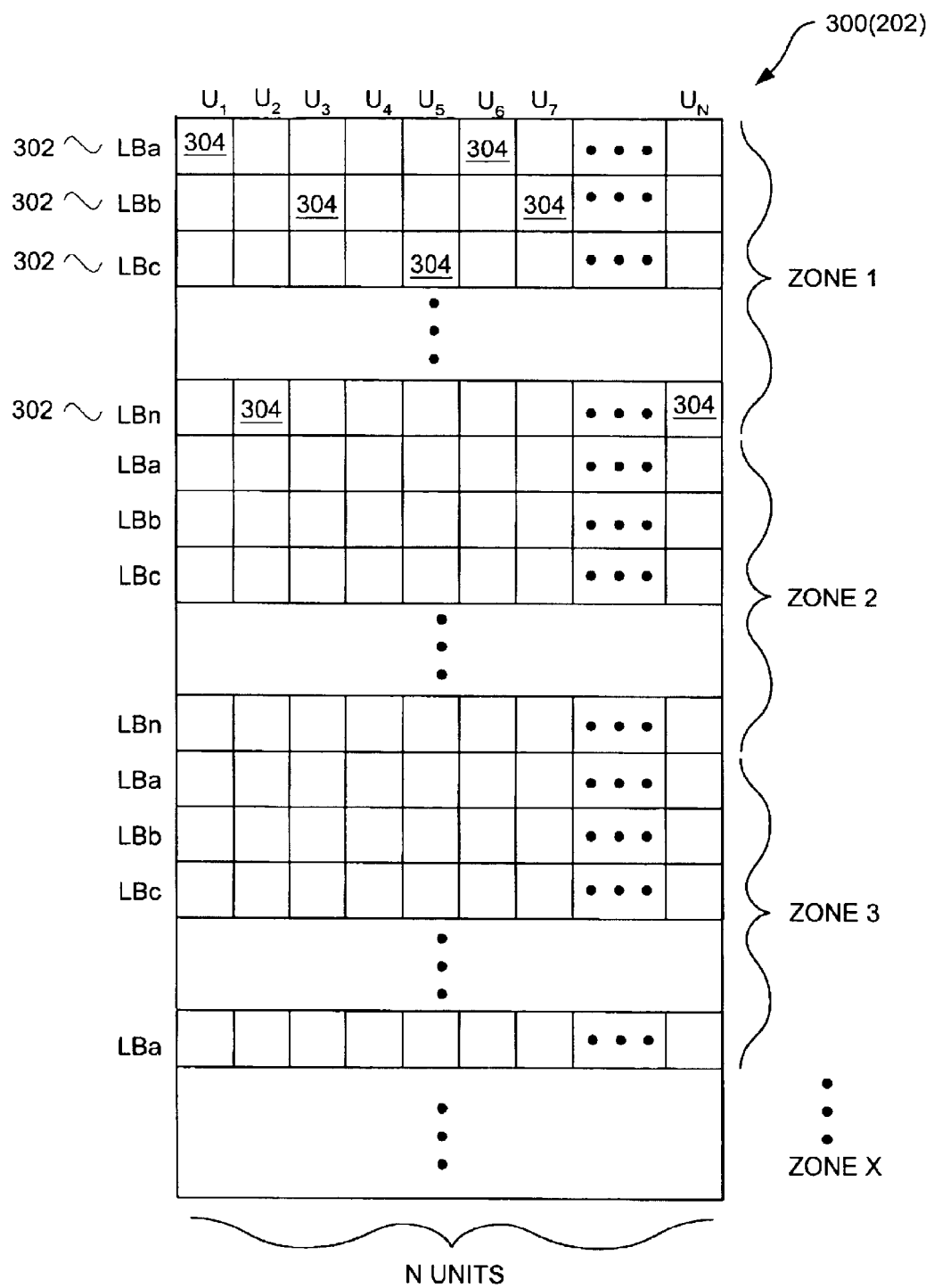
FIG. 3 is a schematic diagram of a memory array according to one embodiment of the invention.

FIG. 3 is a schematic diagram of a memory array 300 according to one embodiment of the invention. The memory array 300 is, for example, suitable for use as the memory array 202 illustrated in FIG. 2. The memory array 300 includes a plurality of zones. Namely, zone 1, zone 2, zone 3, . . . , zone X. Each of the zones have a similar architecture; hence, only zone 1 is described in detail below. Within zone 1, there are a plurality of logical blocks (LB) 302. The logical blocks are designated LBa, LBb, LBc, . . . , LBn. Each logical block 302 contains a plurality of units (U) 304. The logical blocks 302 shown in FIG. 3, each include N units, namely $U_1$, $U_2$, . . . , $U_N$. Each of these units 304, in turn, stores a plurality of bytes of data.

Figure 4A:
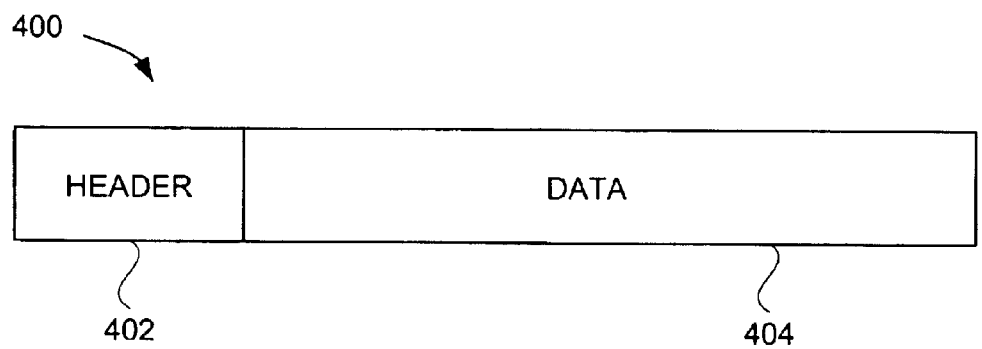
FIG. 4A illustrates a representative format for a unit shown in FIG. 3.

FIG. 4A illustrates a representative format for a unit 304 shown in FIG. 3. The unit 400 shown in FIG. 4A includes a header portion 402 and a data portion 404. The header portion 402 is also referred to as overhead or overhead information. The header portion 402 includes at least a logical address for a particular unit 304. The data portion 404 stores the data. The unit 400 thus pertains to a plurality of bytes of information. As an example, the unit can represent 540 bytes of information, most of which pertain to the data portion 404.

Figure 4B:
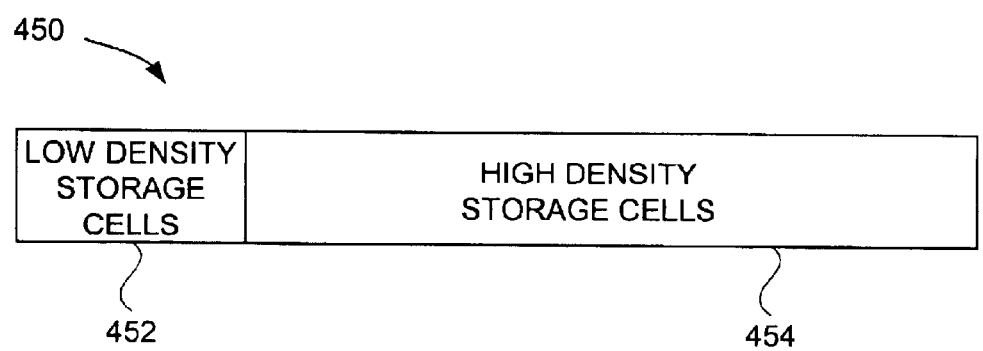
FIG. 4B illustrates a representative density configuration for a unit shown in FIG. 3.

In one embodiment, the units 304 within the logical blocks 302 can be arranged such that the physical addresses associated with units 304 are contiguous within a logical block 302. Further, each logical block 302 can contain a fixed set (or range) of units 304. These features allow for the reading of only of the first unit ($U_1$) 304 within each logical block 302 of a zone in order to create the logical-to-physical address conversion table for the zone. In addition, the first unit ($U_1$) 304 of the logical blocks 302 of a zone also utilizes a combination of low density storage and high density storage. For example, as shown in FIG. 4B, a representative density configuration 450 for the first unit ($U_1$) 304 within each logical block 302 can utilize low density storage cells 452 to store the header 402 of the first unit ($U_1$) 304, and can use high density storage cells 454 for storage of the data 404 associated with the first unit ($U_1$) 304, as well as all the other units 304 of the logical blocks 302.

Figure 5:
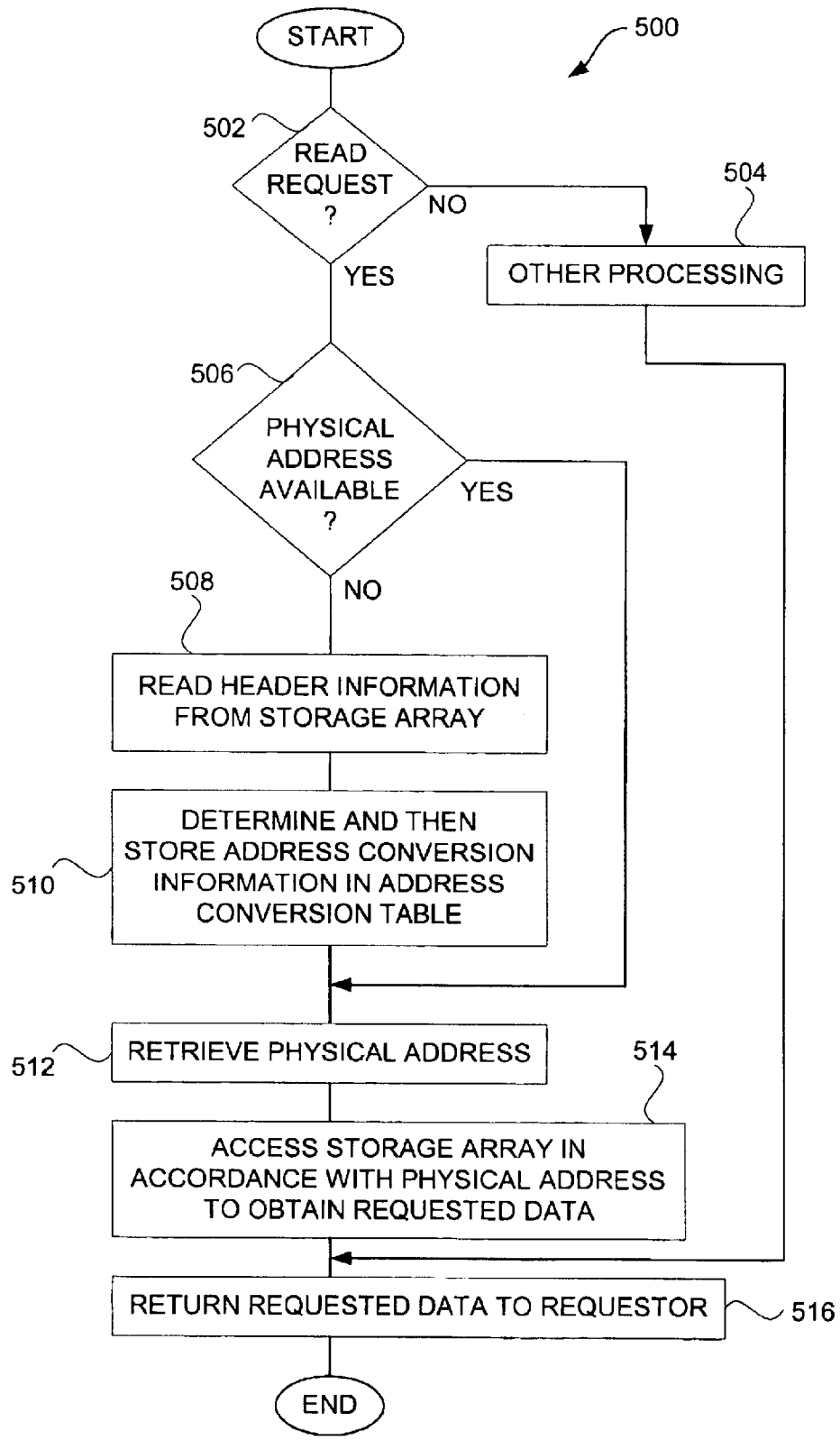
FIG. 5 is a flow diagram of read processing according to one embodiment of the invention.

FIG. 5 is a flow diagram of read processing 500 according to one embodiment of the invention. The read processing 500 is, for example, performed by a memory controller during reading of certain data from a memory array. As examples, the read processing 500 can be performed by the memory controller 104 illustrated in FIG. 1 or the memory controller 210 illustrated in FIG. 2.

The read processing 500 begins with a decision 502 that determines whether a read request has been received. For example, a host controller can initiate the read processing 500 by issuing a read request. When the decision 502 determines that a read request has not been received, then other processing 504 can be performed. The other processing 504 can pertain to write, erase or other system operations.

On the other hand, when a decision 502 determines that a read request has been received, a decision 506 determines whether a corresponding physical address is available. The corresponding physical address identifies the precise physical location in a memory array for the data to be read therefrom. The physical address is available when the appropriate address conversion table (i.e., logical-to-physical conversion table) is available at the memory system (namely, within the RAM of the memory system). When the decision 506 determines that the corresponding physical address for the read request is not available, then header information is read 508 from a storage array (memory array). The header information includes or identifies at least one or more logical addresses for a logical block within the storage array. According to the invention, the logical addresses being read from the storage array are stored in low density storage areas of the storage array. Accordingly, these logical addresses being read 508 are able to be read in a high-speed fashion. Next, the address conversion information is determined and then stored 510 in the address conversion table. At this point, the corresponding physical address for the requested data becomes available as the needed address conversion information is now available in the address conversion table. Likewise, when the decision 506 determines that the corresponding physical address is available, the operations 508 and 510 can be bypassed.

In either case, following the operation 506 when the corresponding physical address is initially available or otherwise following the operation 510, the corresponding logical address is retrieved 512. Here, the corresponding physical address to the logical address of the read request is retrieved from the address conversion table. Then, the storage array is accessed 514 in accordance with the physical address to obtain the requested data. Here, the portion of the storage array that is being accessed to obtain the requested data utilizes high density storage so that the area of the storage array is efficiently utilized. Thereafter, the requested data is returned 516 to the requester. Following the operation 516, the read processing 500 is complete and ends.

It should be noted that in one embodiment of the invention a sub-portion of a unit can be read (sensed) and then supplied to a memory controller (on-chip or off-chip). For example, a header portion can be read (sensed) separate from a data portion. In other words, when the header portion provides low density storage and the data portion provides high density storage, either the header portion or the data portion can be read (sensed).

Additionally, it should be understood that the reading of data from low density storage areas is faster than reading data from high density storage areas. For example, consider a representative example where the high density storage areas store 4 bits (or 16 states) per memory cell and where the low density storage areas store 1 bit (or 2 states) per memory cell. Cell read operations are typically performed on a memory cell to read and compare the read data at one or more voltage levels to discriminate which of its available states the memory cell is in. The performance improvement in reading data from low density areas is that less cell read operations are needed, For example, in the representative example, when a memory cell stores sixteen (16) different states (i.e., high density area), then fifteen (15) cell read operations are needed. However, when reading data from the memory cells storing only two (2) different states (i.e., low density area), then only a single cell read operation is needed. As a consequence, selective use of low density storage (1-bit) in a hybrid memory can allow certain data to be read in one-fifteenth of the time it would otherwise take to read the data from memory cells storing 4 bits. In one implementation of the cell read processing, certain cell reads are able to be skipped when performing cell reads with respect to memory cells using lower density storage. In the above example, fourteen (14) of the fifteen (15) cell read operations needed for memory cells storing sixteen (16) different states can be skipped when reading data from the memory cells storing only two (2) different states. A memory controller (e.g., memory controller 104, 210) maintains an indication of which areas or memory cells are high density and which are low density so that the cell read operations can be efficiently controlled by the memory controller. Alternatively, the hybrid memory itself could make the determination, particularly if such areas were dedicated as to their storage density. Other techniques can be used to reduce the number of cell read operations that need to be performed for high density areas. One such technique is a binary search which in its best case reduces the number of cell read operations from sixteen (16) to four (4) cell read operations. Even in such a case, selective use of low density storage (1-bit) in a hybrid memory would still allow certain data to be read in at least one-fourth of the time it would otherwise take to read the data from memory cells storing 4 bits.

The invention can further pertain to an electronic system that includes a memory system as discussed above. Memory systems (i.e., memory cards) are commonly used to store digital data for use with various electronic products. Often, the memory system is removable from the electronic system so that the stored digital data is portable. The memory systems according to the invention can have a relatively small form factor and be used to store digital data for electronic products such as cameras, hand-held or notebook computers, network cards, network appliances, set-top boxes, hand-held or other small audio players/recorders (e.g., MP3 devices), and medical monitors.

The advantages of the invention are numerous. Different embodiments or implementations may yield one or more of the following advantages. One advantage of the invention is that a memory system can yield both high density storage and high performance operation. Another advantage of the invention is that high and low density operation of data storage elements can be intermixed for increased performance or robustness. Yet another advantage of the invention is that data storage elements can have a common design, regardless of whether the elements provided are high or low density storage. Still another advantage of the invention is that reliable, high performance memory systems can be obtained.

The many features and advantages of the present invention are apparent from the written description and, thus, it is intended by the appended claims to cover all such features and advantages of the invention. Further, since numerous modifications and changes will readily occur to those skilled in the art, the invention is not to be limited to the exact construction and operation as illustrated and described. Hence, all suitable modifications and equivalents may be resorted to as falling within the scope of the invention.

What is claimed is:

1. A memory system that couples to a host, said memory system comprising:
   a plurality of storage elements, a first portion of said storage elements for providing low density storage, and a second portion of said storage elements for providing high density storage; and
   a controller operatively connected to said storage elements, said controller operates to receive commands for data access from the host and to control reading and writing of data into said storage elements in accordance with the commands,
   wherein said storage elements are non-volatile storage elements.

2. A memory system as recited in claim 1, wherein said storage elements are identical regardless of whether associated with the first portion or the second portion.

3. A memory system as recited in claim 1, wherein said storage elements are provided on a common substrate.

4. A memory system as recited in claim 1, wherein said memory system is provided within a single portable semiconductor memory product.

5. A memory system that couples to a host, said memory system comprising:
   a plurality of storage elements, a first portion of said storage elements for providing low density storage, and a second portion of said storage elements for providing high density storage; and
   a controller operatively connected to said storage elements, said controller operates to receive commands for data access from the host and to control reading and writing of data into said storage elements in accordance with the commands,
   wherein said storage elements configured for low density storage store one or two bits per cell, and wherein said storage elements configured for high density storage store four or more bits per cell.

6. A memory system that couples to a host, said memory system comprising:
   a plurality of storage elements, a first portion of said storage elements for providing low density storage, and a second portion of said storage elements for providing high density storage; and
   a controller operatively connected to said storage elements, said controller operates to receive commands for data access from the host and to control reading and writing of data into said storage elements in accordance with the commands,
   wherein said storage elements are Flash type storage elements.

7. A memory system that couples to a host, said memory system comprising:
   a plurality of storage elements, a first portion of said storage elements for providing low density storage, and a second portion of said storage elements for providing high density storage; and
   a controller operatively connected to said storage elements, said controller operates to receive commands for data access from the host and to control reading and writing of data into said storage elements in accordance with the commands,
   wherein said storage elements configured for low density storage store one bit per cell, and wherein said storage elements configured for high density storage store two or more bits per cell.

8. A memory system as recited in claim 5, wherein said storage elements are Flash type storage elements.

9. A memory system as recited in claim 5, wherein said storage elements are EEPROM type storage elements.

10. A hybrid memory device having a single substrate, said hybrid memory device comprising:
    a plurality of low density storage elements;
    a plurality of high density storage elements; and
    a controller operatively connected to said low density storage elements and said high density storage elements, said controller operates to control read, write and erasure of data into said low density storage elements and said high density storage elements,
    wherein said low density storage elements and said high density storage elements are memory cells, and
    wherein said low density storage elements store one or two bits per cell, and wherein said high density storage elements store four or more bits per cell.

11. A hybrid memory device having a single substrate, said hybrid memory device comprising:
    a plurality of low density storage elements;
    a plurality of high density storage elements; and
    a controller operatively connected to said low density storage elements and said high density storage elements, said controller operates to control read, write and erasure of data into said low density storage elements and said high density storage elements,
    wherein said low density storage elements and said high density storage elements are memory cells, and
    wherein said low density storage elements store two bits per cell, and wherein said high density storage elements store four bits per cell.

12. A hybrid memory device having a single substrate, said hybrid memory device comprising:
    a plurality of low density storage elements;
    a plurality of high density storage elements; and
    a controller operatively connected to said low density storage elements and said high density storage elements, said controller operates to control read, write and erasure of data into said low density storage elements and said high density storage elements,
    wherein said low density storage elements and said high density storage elements are Flash type storage elements or EEPROM type storage elements.

13. A hybrid memory device as recited in claim 10, wherein said low density storage elements and said high density storage elements have a common device structure.

14. A hybrid memory device as recited in claim 13, wherein data stored to said low density storage elements can be read in substantially less time than it takes to read data from said high density storage elements.

15. A hybrid memory device having a single substrate, said hybrid memory device comprising:
- a plurality of low density storage elements;
- a plurality of high density storage elements; and
- a controller operatively connected to said low density storage elements and said high density storage elements, said controller operates to control read, write and erasure of data into said low density storage elements and said high density storage elements,
- wherein said low density storage elements and said high density storage elements have a common device structure,
- wherein data stored to said low density storage elements can be read in substantially less time than it takes to read data from said high density storage elements, and
- wherein the common device structure is a Flash device structure.

16. A hybrid memory device having a single substrate, said hybrid memory device comprising:
- a plurality of low density storage elements;
- a plurality of high density storage elements; and
- a controller operatively connected to said low density storage elements and said high density storage elements, said controller operates to control read, write and erasure of data into said low density storage elements and said high density storage elements,
- wherein said low density storage elements and said high density storage elements have a common device structure,
- wherein data stored to said low density storage elements can be read in substantially less time than it takes to read data from said high density storage elements, and
- wherein said hybrid memory device is a portable memory card having non-volatile memory, and
- wherein said low density storage elements and said high density storage elements are non-volatile storage elements.

* * * * *

UNITED STATES PATENT AND TRADEMARK OFFICE
CERTIFICATE OF CORRECTION

PATENT NO. : 6,807,106 B2
DATED : October 19, 2004
INVENTOR(S) : Gonzalez et al.

It is certified that error appears in the above-identified patent and that said Letters Patent is hereby corrected as shown below:

<u>Title page,</u>
Item [75], Inventors, delete "Carlos Gonzales" and insert -- Carlos Gonzalez --.

Signed and Sealed this

Tenth Day of January, 2006

JON W. DUDAS
*Director of the United States Patent and Trademark Office*